(12) United States Patent
Kamiya

(10) Patent No.: US 6,211,694 B1
(45) Date of Patent: *Apr. 3, 2001

(54) BUS DRIVER HAVING NOISE REMOVING CIRCUIT

(75) Inventor: Hiroshi Kamiya, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/084,207

(22) Filed: May 26, 1998

(30) Foreign Application Priority Data

May 26, 1997 (JP) .................................. 9-135315

(51) Int. Cl.[7] .................. H03K 17/16; H03K 19/003
(52) U.S. Cl. .................. 326/26; 326/86; 326/90; 326/27
(58) Field of Search .................. 326/86, 26, 27, 326/90, 30, 82

(56) References Cited

U.S. PATENT DOCUMENTS

| | | | |
|---|---|---|---|
| 4,754,170 | * | 6/1988 | Toda et al. .................. 326/27 |
| 5,034,631 | * | 7/1991 | Mouret .................. 326/75 |
| 5,107,143 | * | 4/1992 | Ueno et al. .................. 326/90 |
| 5,132,564 | * | 7/1992 | Fletcher et al. .................. 326/30 |
| 5,136,187 | * | 8/1992 | Ceccherelli et al. .................. 326/30 |
| 5,298,808 | * | 3/1994 | Terrell et al. .................. 326/68 |
| 5,568,060 | * | 10/1996 | Bartholomay et al. .................. 326/86 |
| 5,852,383 | * | 12/1998 | Rombach .................. 327/538 |
| 5,852,540 | * | 12/1998 | Haider .................. 361/111 |
| 6,057,702 | * | 5/2000 | Kamiya .................. 326/26 |

FOREIGN PATENT DOCUMENTS

| | | |
|---|---|---|
| 56-54525 | 5/1981 | (JP) . |
| 62-22121 | 1/1987 | (JP) . |
| 64-73411 | 3/1989 | (JP) . |
| 1-261713 | 10/1989 | (JP) . |
| 2-168310 | 6/1990 | (JP) . |
| 3-250813 | 11/1991 | (JP) . |
| 8-251000 | 9/1996 | (JP) . |
| 9-121148 | 5/1997 | (JP) . |

* cited by examiner

Primary Examiner—Michael Tokar
Assistant Examiner—Daniel D. Chang
(74) Attorney, Agent, or Firm—Sughrue, Mion, Zinn, Macpeak & Seas, PLLC

(57) ABSTRACT

In a bus driver for driving a bus having an input terminal for receiving an input signal and an output terminal connected to the bus, a switching element is provide between the output terminal and the second power supply terminal, and the switching element is controlled by a voltage at the input terminal. A diode and a resistor are connected in series between the first power supply terminal and the output terminal. The diode is arranged in a forward conduction direction with respect to the first and second power supply terminals.

22 Claims, 10 Drawing Sheets

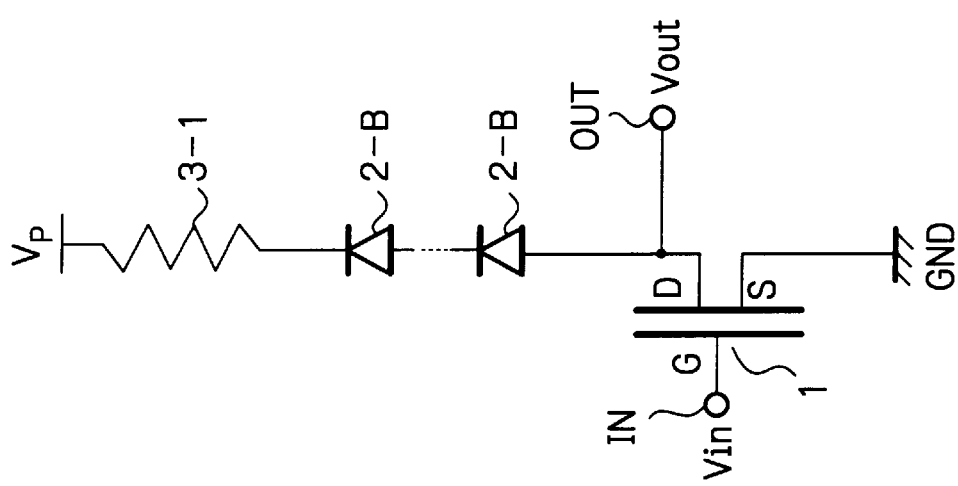
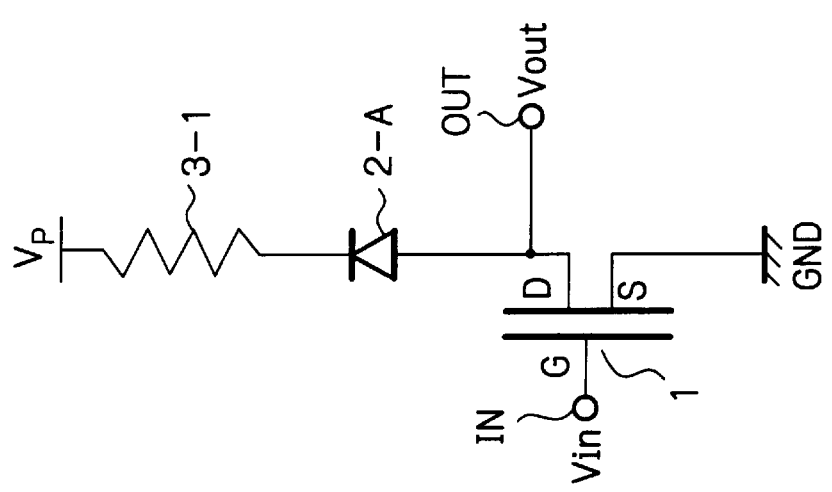
Fig. 5A  Fig. 5B  Fig. 5C

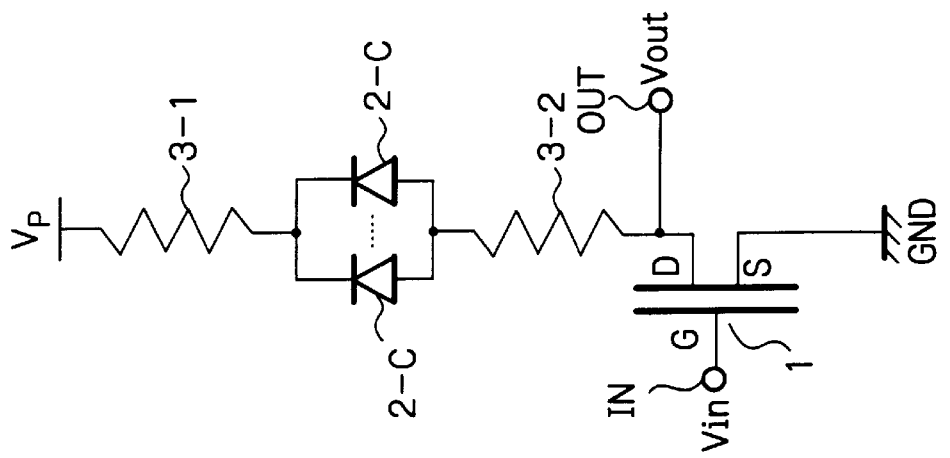
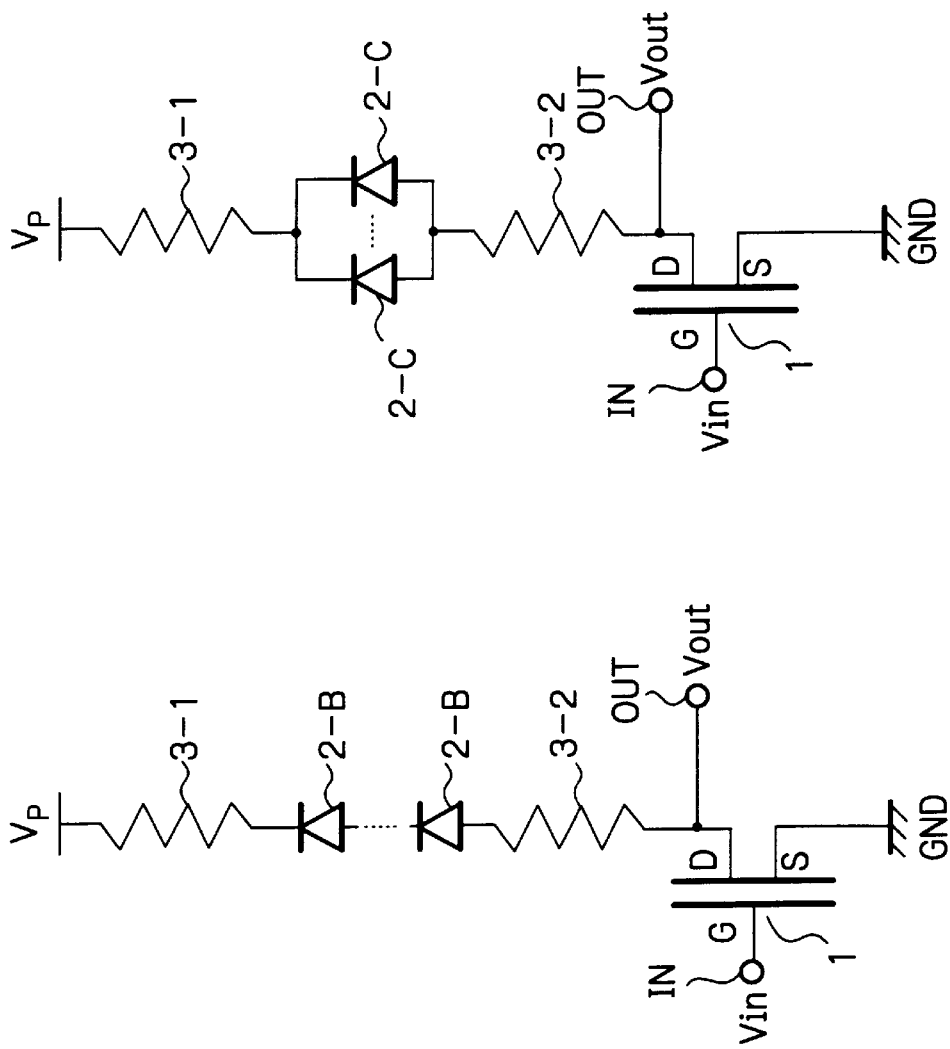
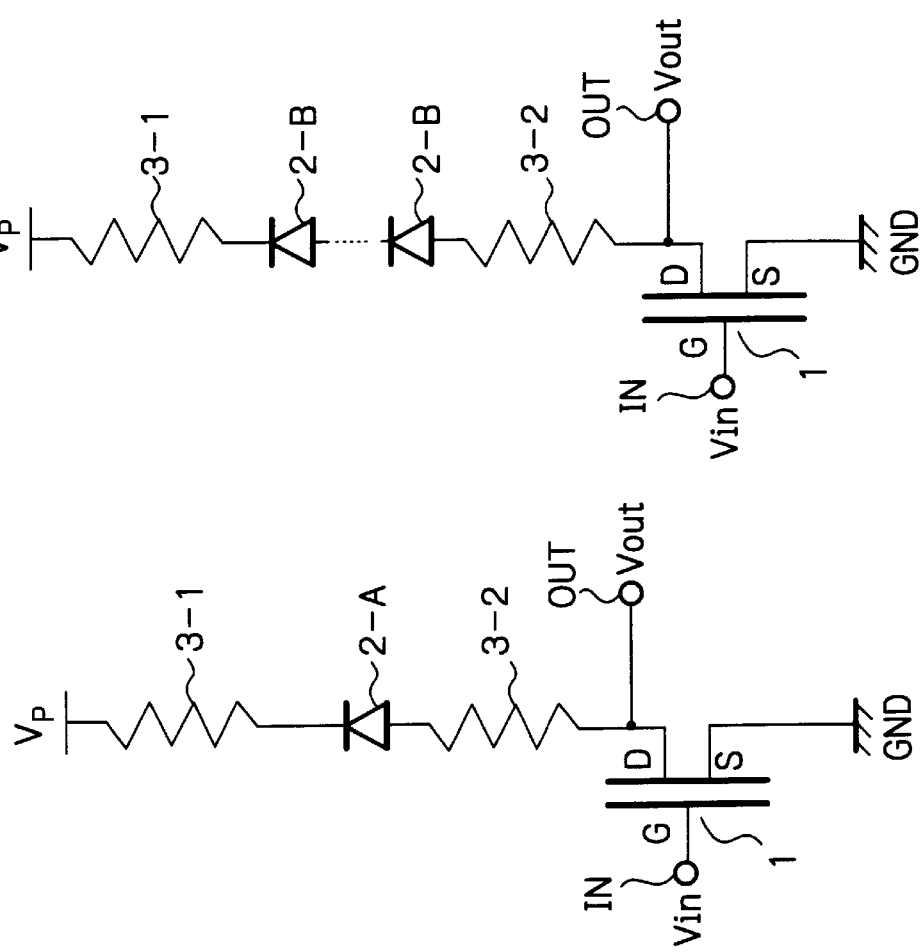

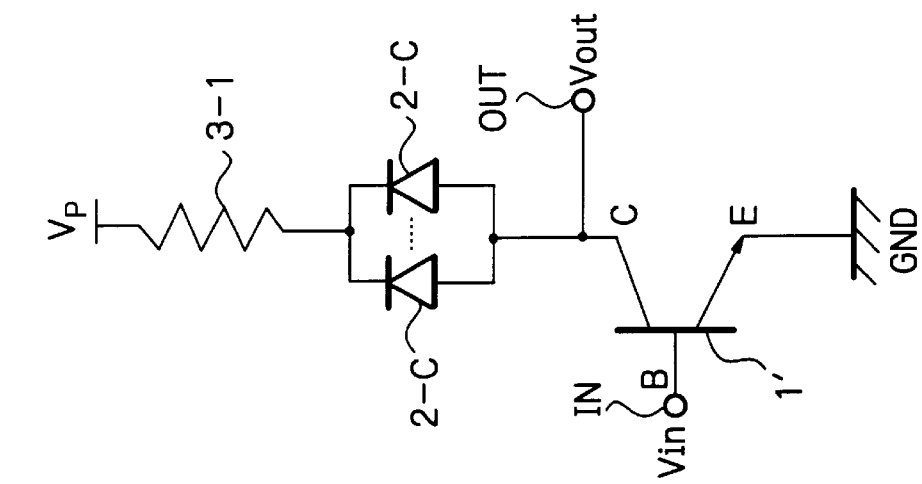
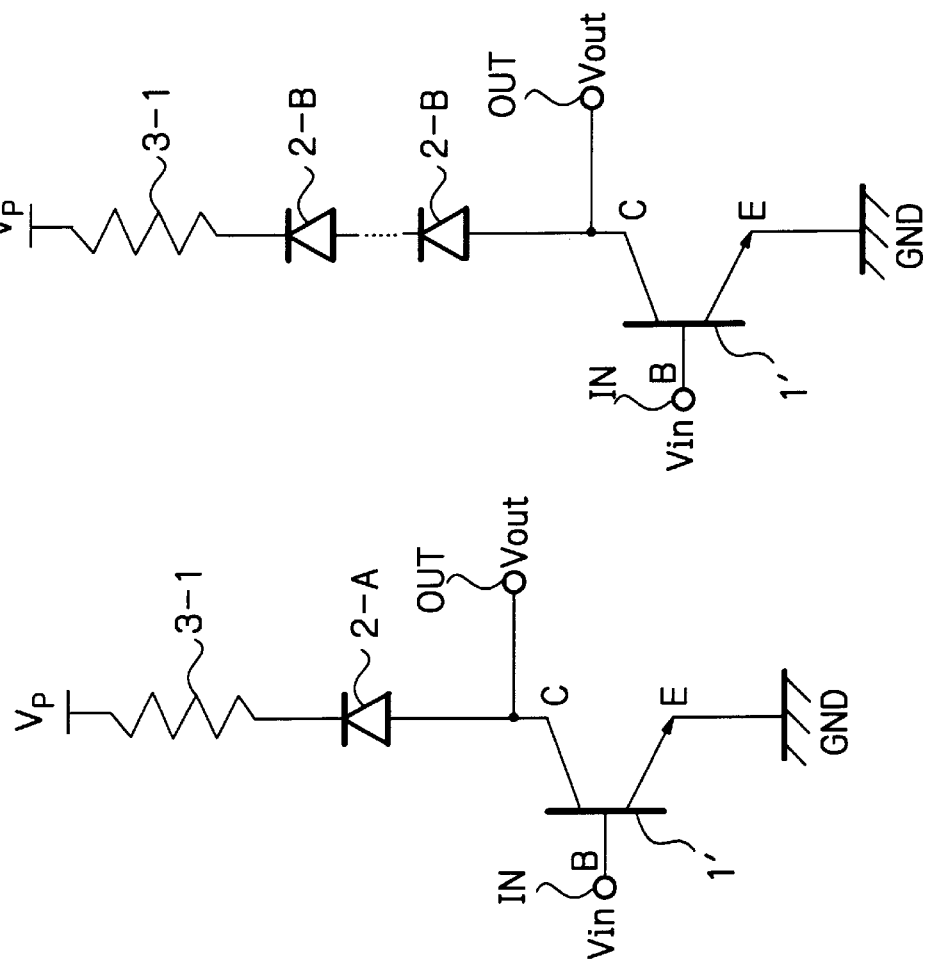

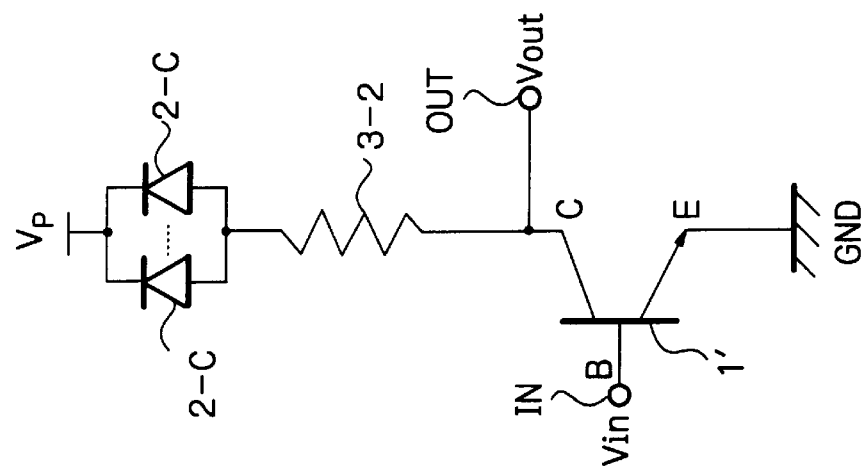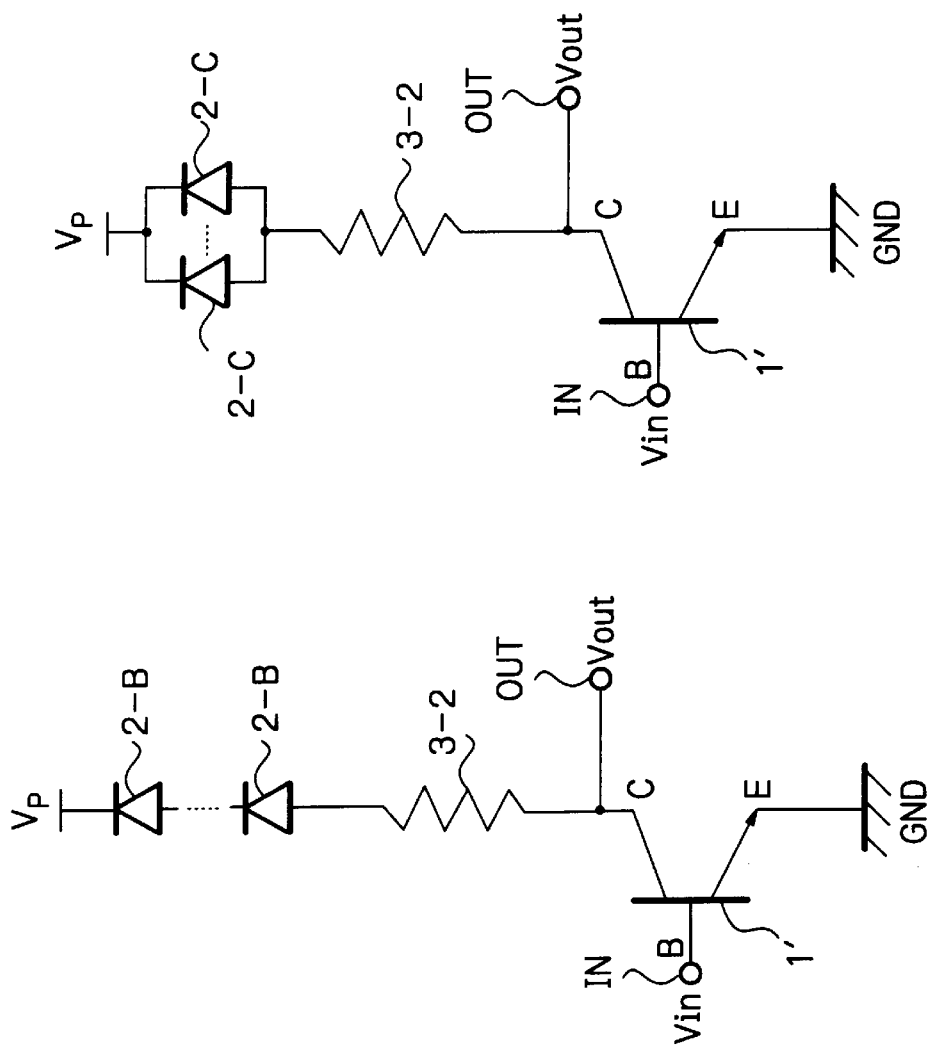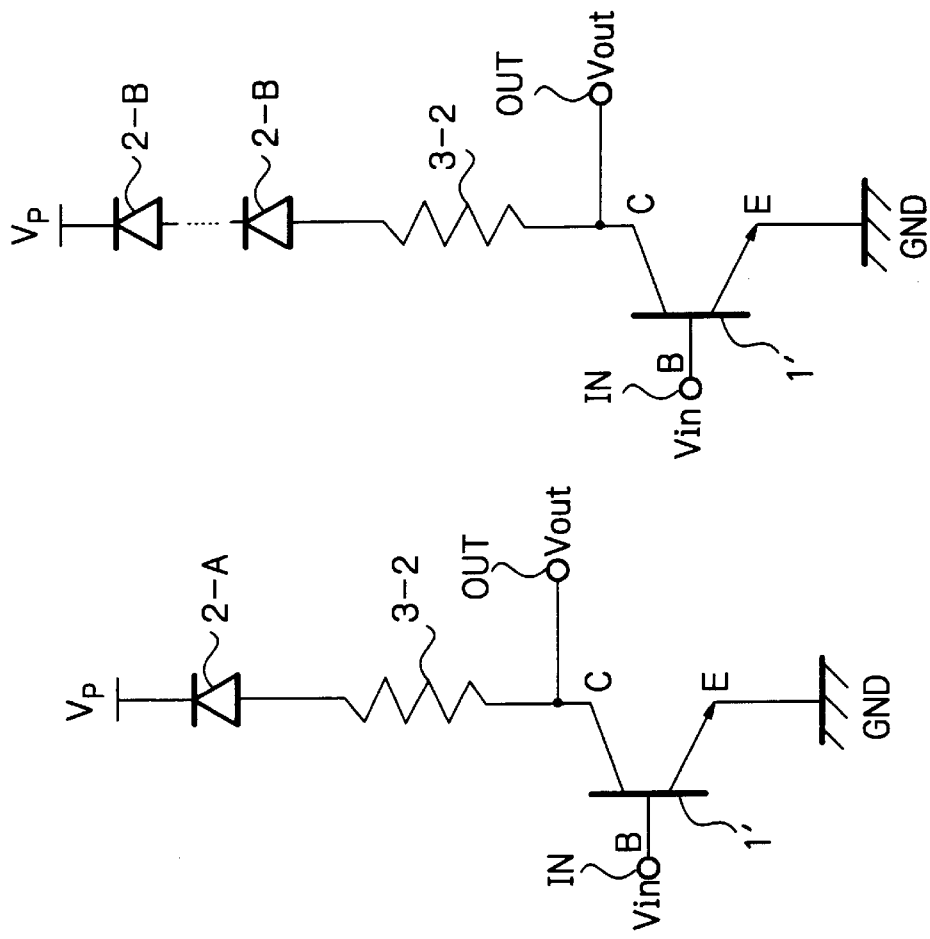

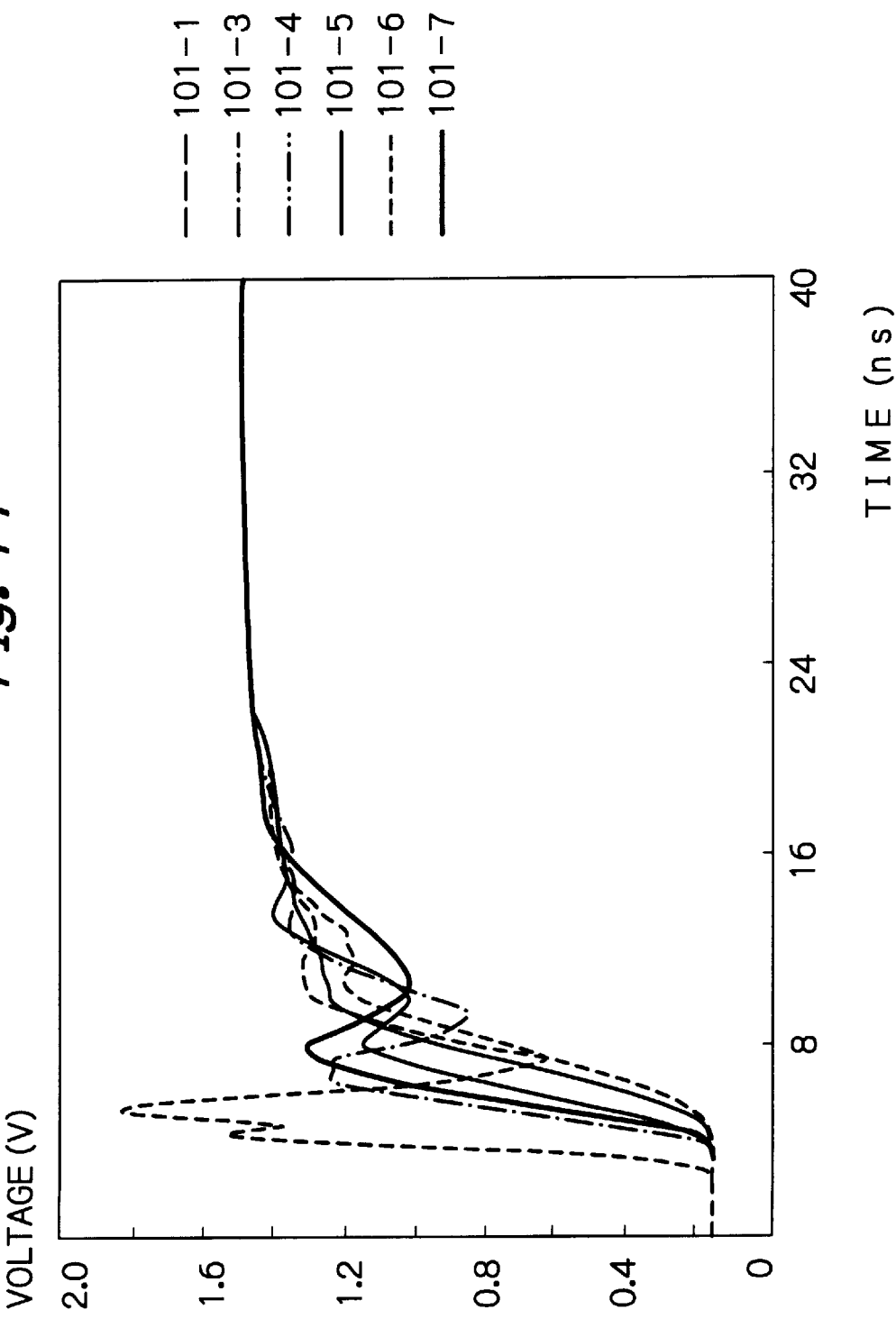

BUS DRIVER HAVING NOISE REMOVING CIRCUIT

BACKGROUND OF THE INVENTION

1. Field of the Invention

The present invention relates to a bus driver for a data processing system.

2. Description of the Related Art

In a data processing system, a plurality of packages each including a semiconductor integrated circuit are inserted into a back panel. The packages share buses formed on the back panel. In this case, each of the packages has a bus driver and a bus receiver.

A prior art bus driver includes an open drain type metal oxide semiconductor (MOS, or more broadly, metal insulating semiconductor (MIS)). This will be explained later in detail.

However, since the prior art bus driver per se does not include a noise removing circuit, a large ringing effect is generated in the bus. Therefore, it takes a long time to converge the ringing effect, which substantially increases the propagation delay time of signals from the bus driver to its respective bus receivers.

SUMMARY OF THE INVENTION

It is an object of the present invention to reduce the ringing effect in a bus driver, thus substantially reducing the signal propagation delay time.

According to the present invention, in a bus driver for driving a bus having an input terminal for receiving an input signal and an output terminal connected to the bus, a switching element is provided between the output terminal and the second power supply terminal, and the switching element is controlled by a voltage at the input terminal. A diode and a resistor are connected in series between the first power supply terminal and the output terminal. The diode is arranged in a forward conduction direction with respect to the first and second power supply terminals.

BRIEF DESCRIPTION OF THE DRAWINGS

The present invention will be more clearly understood from the description as set forth below, as compared with the prior art, with reference to the accompanying drawings, wherein:

FIG. 5A is a circuit diagram illustrating a first embodiment of the bus driver according to the present invention;

FIGS. 5B and 5C are circuit diagrams illustrating modifications of the bus driver of FIG. 5A;

FIG. 6A is a circuit diagram illustrating a second embodiment of the bus driver according to the present invention;

FIGS. 6B and 6C are circuit diagrams illustrating modifications of the bus driver of FIG. 6A;

FIG. 8A is a circuit diagram illustrating a fourth embodiment of the bus driver according to the present invention;

FIGS. 8B and 8C are circuit diagrams illustrating modifications of the bus driver of FIG. 8A;

FIG. 10A is a circuit diagram illustrating a sixth embodiment of the bus driver according to the present invention;

FIGS. 10B and 10C are circuit diagrams illustrating modifications of the bus driver of FIG. 10A; and FIG. 11 is a timing diagram showing the effect of the present invention.

DESCRIPTION OF THE PREFERRED EMBODIMENTS

Before the description of the preferred embodiments, a prior art bus driver will be explained with reference to FIGS. 1, 2, 3 and 4.

Figure 1:
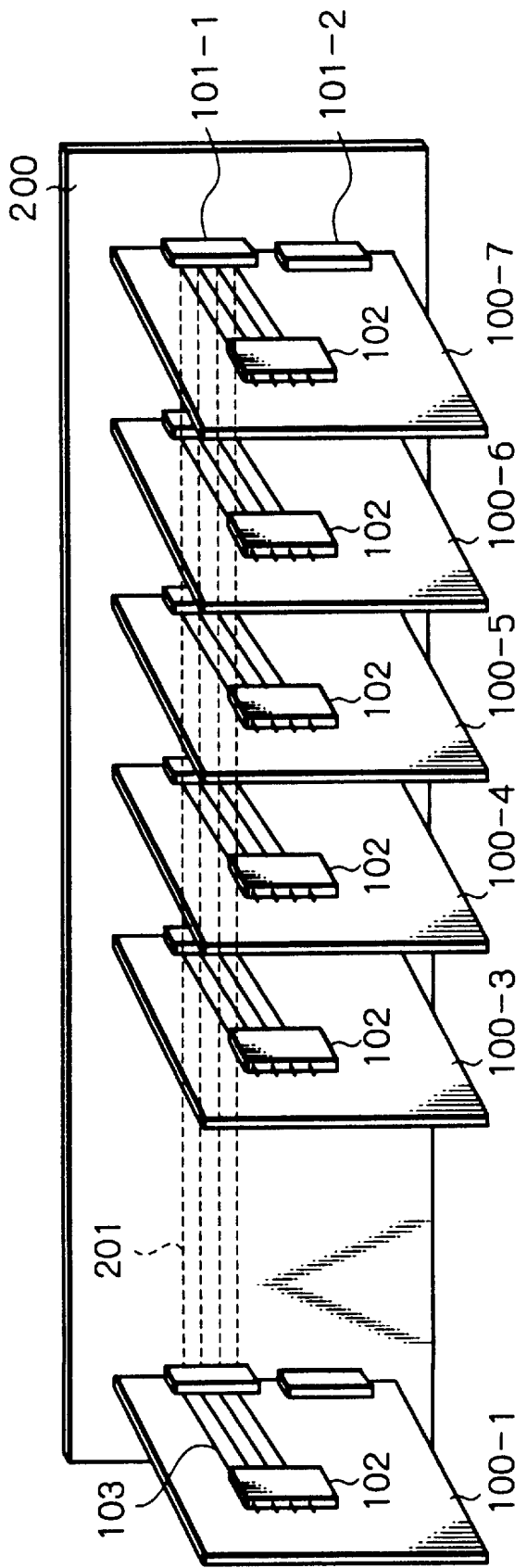
FIG. 1 is a block circuit diagram illustrating a prior art data processing system.

In FIG. 1, which illustrates a prior art data processing system, packages 100-1, 100-3, 100-4, . . . , 100-7 are inserted into a back panel 200 by connectors 101-1 and 101-2. In this case, a package 100-2 is not inserted into the back panel 200 intentionally. Thus, the packages 100-1, 100-3, 100-4, . . . , 100-7 share a bus 201 formed on the back panel 200.

One bus driver 102 is mounted on each of the packages 100-1, 100-3, 100-4, . . . , 100-7. The bus driver 102 is connected via a signal line 103 and the connector 101-1 to the bus 201. Also, one bus receiver (not shown) is mounted on each of the packages 100-1, 100-3, 100-4, . . . , 100-7. The bus receiver is connected via a signal line (not shown) and the connector 101-2 to a bus (not shown) formed on the back panel 200.

Figure 2:
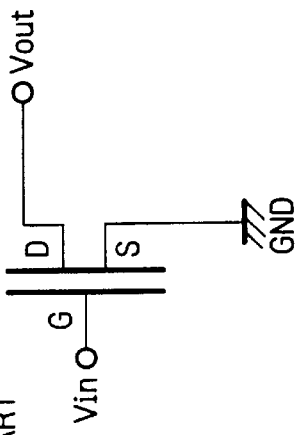
FIG. 2 is a circuit diagram of the bus driver of FIG. 1.

In FIG. 2, which is a circuit diagram of the bus driver 102 of FIG. 1, the bus driver 102 is formed by an open drain type MOS transistor having a gate for receiving an input voltage $V_{in}$, a grounded source and a drain for generating an output voltage $V_{out}$. That is, the bus driver of FIG. 2 does not have a noise removing circuit.

Figure 3:
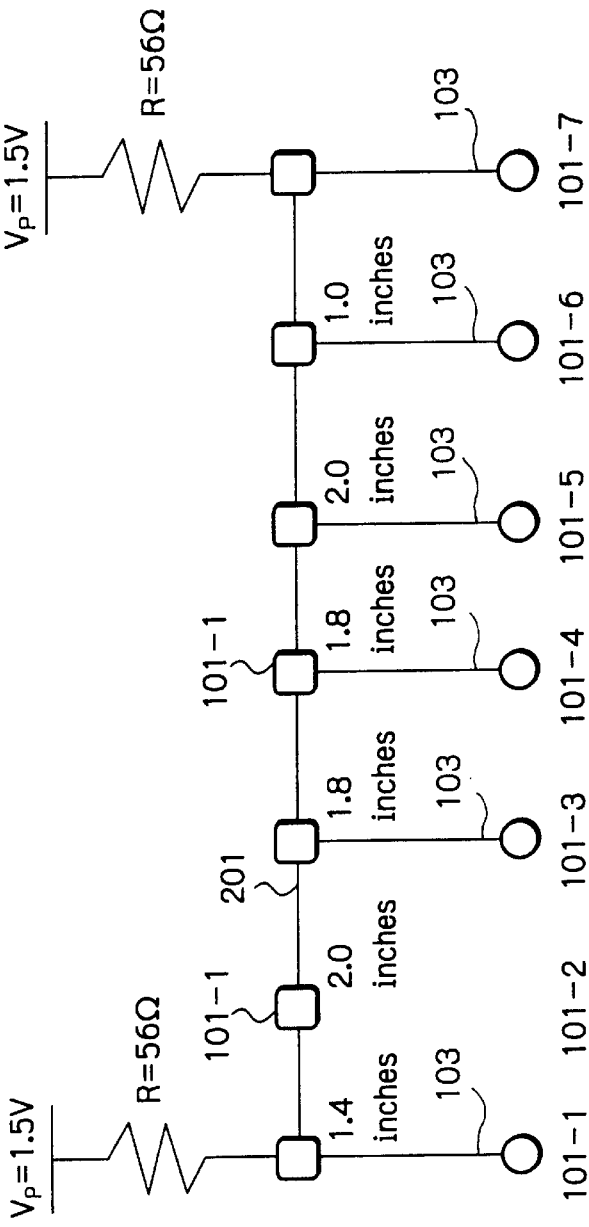
FIG. 3 is an equivalent circuit diagram of the data processing system of FIG. 1.

In FIG. 3, which is an equivalent circuit diagram of the system of FIG. 1, the spacing between the packages depends upon the height of heat sinks of semiconductor integrated devices mounted thereon. For example, the spacing between the packages 101-1 and 101-2 (in this case, the package 101-2 is removed) is 1.4 inches; the spacing between the packages 101-2 and 101-3 is 2.0 inches; the spacing between the packages 101-3 and 101-4 is 1.8 inches; the spacing between the packages 101-4 and 101-5 is 1.8 inches; the spacing between the packages 101-5 and 101-6 is 2.0 inches; and the spacing between the packages 101-6 and 101-7 is 1.0 inches. Also, the length of a styb 103 of each of the packages is 1 inch. Further, a pull-up resistor R formed on the back panel 200 is connected to the connector 101-1 of each of the packages 101-1 and 101-7.

Figure 4:
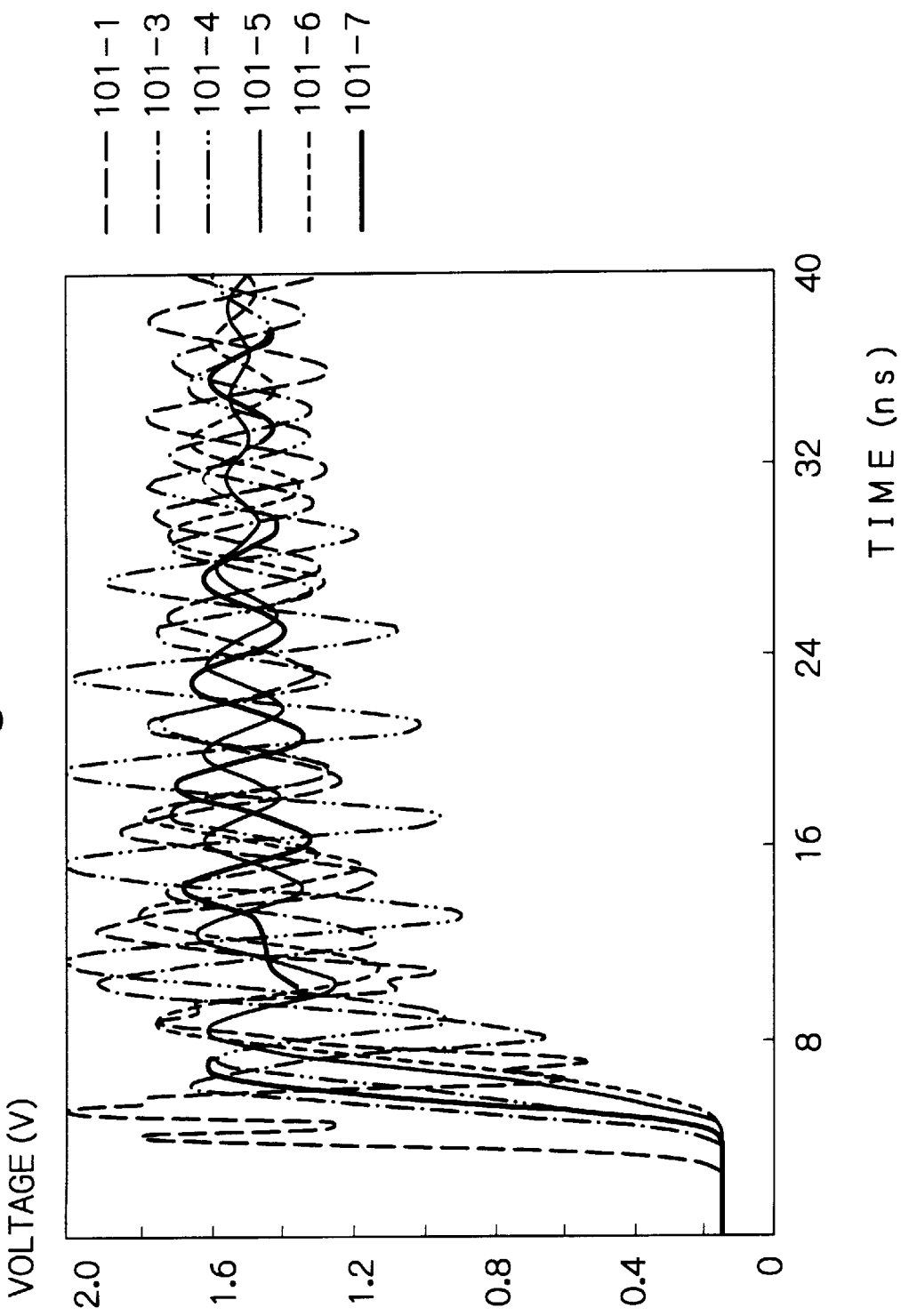
FIG. 4 is a timing diagram showing the received signals at the bus receivers of FIG. 1.

In FIG. 3, when the input voltage $V_{in}$ of the bus driver 102 included in the package 101-3 is switched from high to low, the voltages at the bus receivers at the packages 101-1, 101-3, 101-4, . . . , 101-7 are obtained as shown in FIG. 4. As shown in FIG. 4, a large ringing effect is generated in each of the voltages of the bus receivers since the bus driver 102 does not have a noise removing circuit. That is, it takes longer than 40 ns to converge the voltages at the bus receivers. This substantially increases the signal propagation delay time.

In FIG. 5A, which illustrates a first embodiment of the bus driver according to the present invention, the bus driver includes a MOS transistor 1 as a switching element having a gate connected to an input terminal IN for receiving an input voltage $V_{in}$, a drain connected to an output terminal OUT for generating an output voltage $V_{out}$, and a source connected to the ground terminal GND. Also, the bus driver includes a noise removing circuit formed by a diode 2-A and a resistor 3-1. In this case, an anode of the diode 2-A is connected to the output terminal OUT, and a cathode of the diode 2-A is connected to an end of the resistor 3-1. Also, a positive voltage $V_P$ such as 1.5V is applied to the other end of the resistor 3-1.

In FIG. 5B, which illustrates a first modification of the bus driver of FIG. 5A, series-connected diodes 2-B are provided instead of the diode 2-A of FIG. 5A.

In FIG. 5C, which illustrates a second modification of the bus driver of FIG. 5A, parallel-connected diodes 2-B are provided instead of the diode 2-A of FIG. 5A.

The bus drivers of FIGS. 5B and 5C operate in the same way as the bus driver of FIG. 5A. In this case, the forward current of the diodes 2-B is a little smaller than that of the diode 2-A, while the forward current of the diodes 2-C is a little larger than that of the diode 2-A.

In FIG. 6A, which illustrates a second embodiment of the bus driver according to the present invention, a resistor 3-2 is added to the elements of the bus driver of FIG. 5A. That is, the resistor 3-2 is connected between the anode of the diode 2-A and the output terminal OUT. The bus driver of FIG. 6A operates in the same way as the bus driver of FIG. 5A.

In FIG. 6B, which illustrates a first modification of the bus driver of FIG. 6A, series-connected diodes 2-B are provided instead of the diode 2-A of FIG. 6A.

In FIG. 6C, which illustrates a second modification of the bus driver of FIG. 6A, parallel-connected diodes 2-B are provided instead of the diode 2-A of FIG. 6A.

The bus drivers of FIGS. 6B and 6C operate in the same way as the bus driver of FIG. 6A. In this case, the forward current of the diodes 2-B is a little smaller than that of the diode 2-A, while the forward current of the diodes 2-C is a little larger than that of the diode 2-A.

Figure 7A:
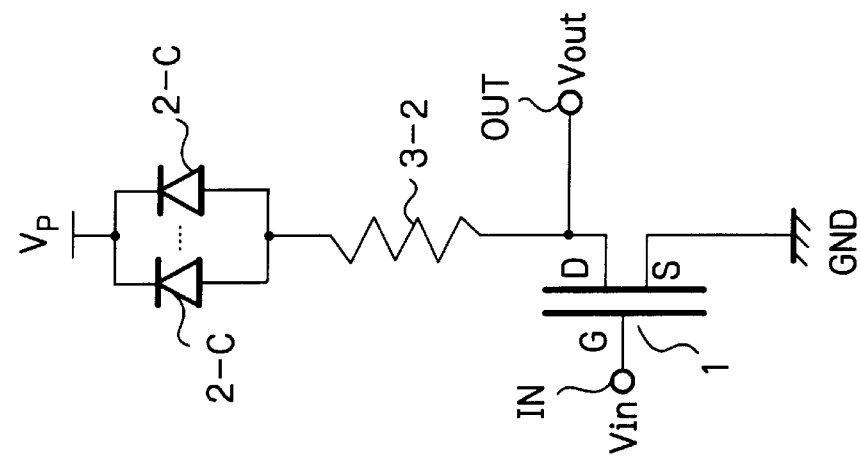
FIG. 7A is a circuit diagram illustrating a third embodiment of the bus driver according to the present invention.

In FIG. 7A, which illustrates a third embodiment of the bus driver according to the present invention, the resistor 3-1 of FIG. 6A is not provided. The bus driver of FIG. 7A operates in the same way as the bus driver of FIG. 5A.

Figure 7B:
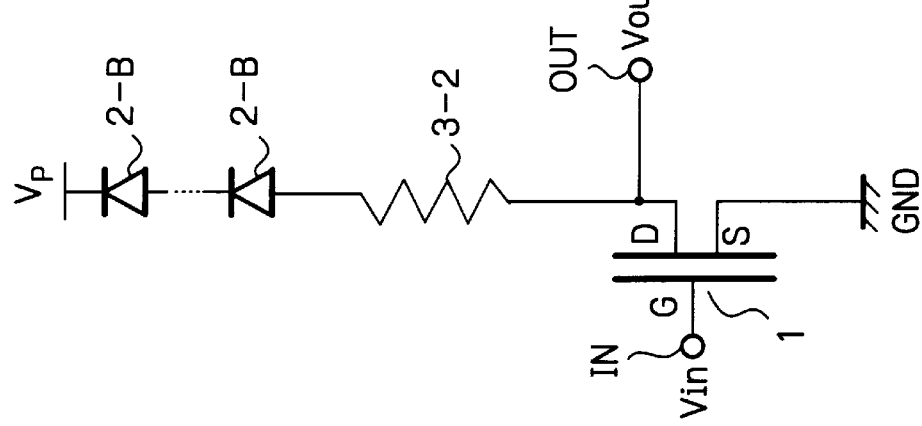
FIGS. 7B and 7C are circuit diagrams illustrating modifications of the bus driver of FIG. 7A.

In FIG. 7B, which illustrates a first modification of the bus driver of FIG. 7A, series-connected diodes 2-B are provided instead of the diode 2-A of FIG. 7A.

Figure 7C:
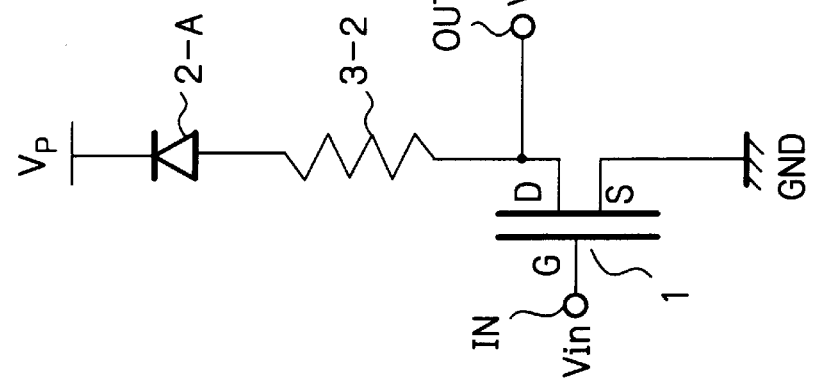

In FIG. 7C, which illustrates a second modification of the bus driver of FIG. 7A, parallel-connected diodes 2-B are provided instead of the diode 2-A of FIG. 7A.

The bus drivers of FIGS. 7B and 7C operate in the same way as the bus driver of FIG. 7A. In this case, the forward current of the diodes 2-B is a little smaller than that of the diode 2-A, while the forward current of the diodes 2-C is a little larger than that of the diode 2-A.

In FIG. 8A, which illustrates a fourth embodiment of the bus driver according to the present invention, the bus driver includes a bipolar transistor 1' instead of the MOS transistor 1 of FIG. 5A. The bipolar transistor 1' has a base connected to the input terminal IN, a collector connected to the output terminal OUT, and an emitter connected to the ground terminal GND. The bus driver of FIG. 8A operates in the same way as the bus driver of FIG. 5A.

In FIG. 8B, which illustrates a first modification of the bus driver of FIG. 8A, series-connected diodes 2-B are provided instead of the diode 2-A of FIG. 8A.

In FIG. 8C, which illustrates a second modification of the bus driver of FIG. 8A, parallel-connected diodes 2-B are provided instead of the diode 2-A of FIG. 8A.

The bus drivers of FIGS. 8B and 8C operate in the same way as the bus driver of FIG. 8A. In this case, he forward current of the diodes 2-B is a little smaller than that of the diode 2-A, while the forward current of the diodes 2-C is a little larger than that of the diode 2-A.

Figure 9A:
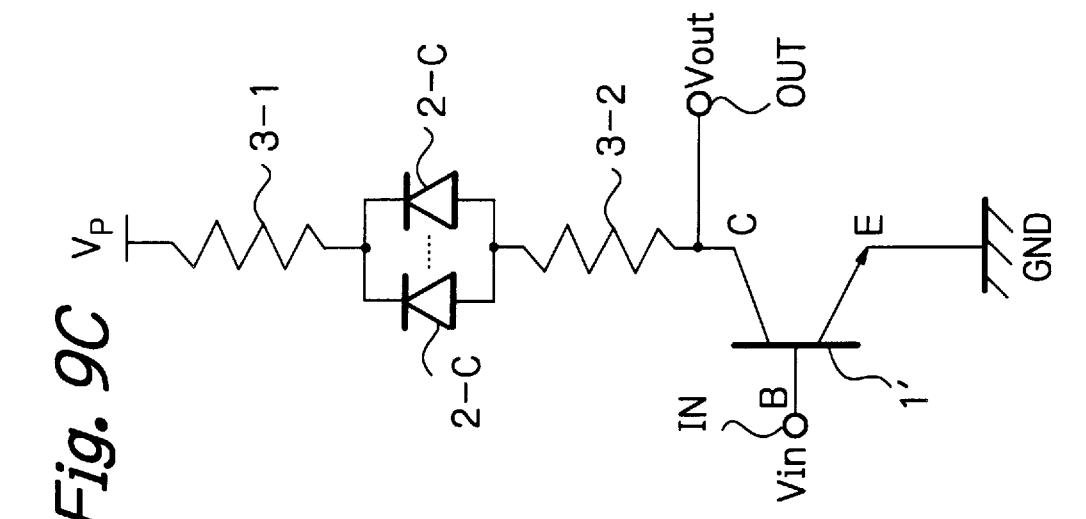
FIG. 9A is a circuit diagram illustrating a fifth embodiment of the bus driver according to the present invention.

In FIG. 9A, which illustrates a fifth embodiment of the bus driver according to the present invention, a resistor 3-2 is added to the elements of the bus driver of FIG. 8A. That is, the resistor 3-2 is connected between the anode of the diode 2-A and the output terminal OUT. The bus driver of FIG. 9A operates in the same way as the bus driver of FIG. 8A.

Figure 9B:
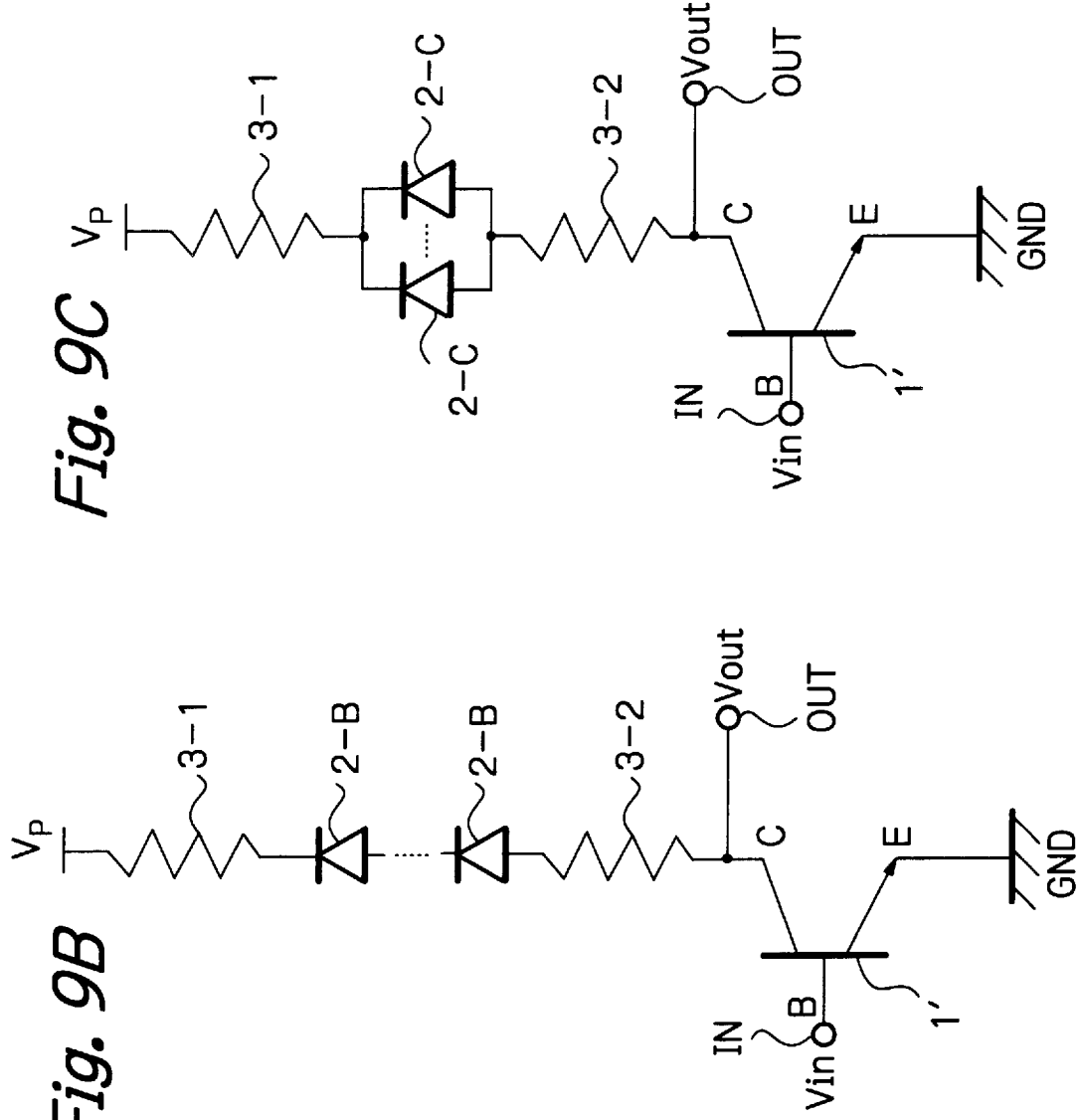
FIGS. 9B and 9C are circuit diagrams illustrating modifications of the bus driver of FIG. 9A.

In FIG. 9B, which illustrates a first modification of the bus driver of FIG. 9A, series-connected diodes 2-B are provided instead of the diode 2-A of FIG. 9A.

Figure 9C:
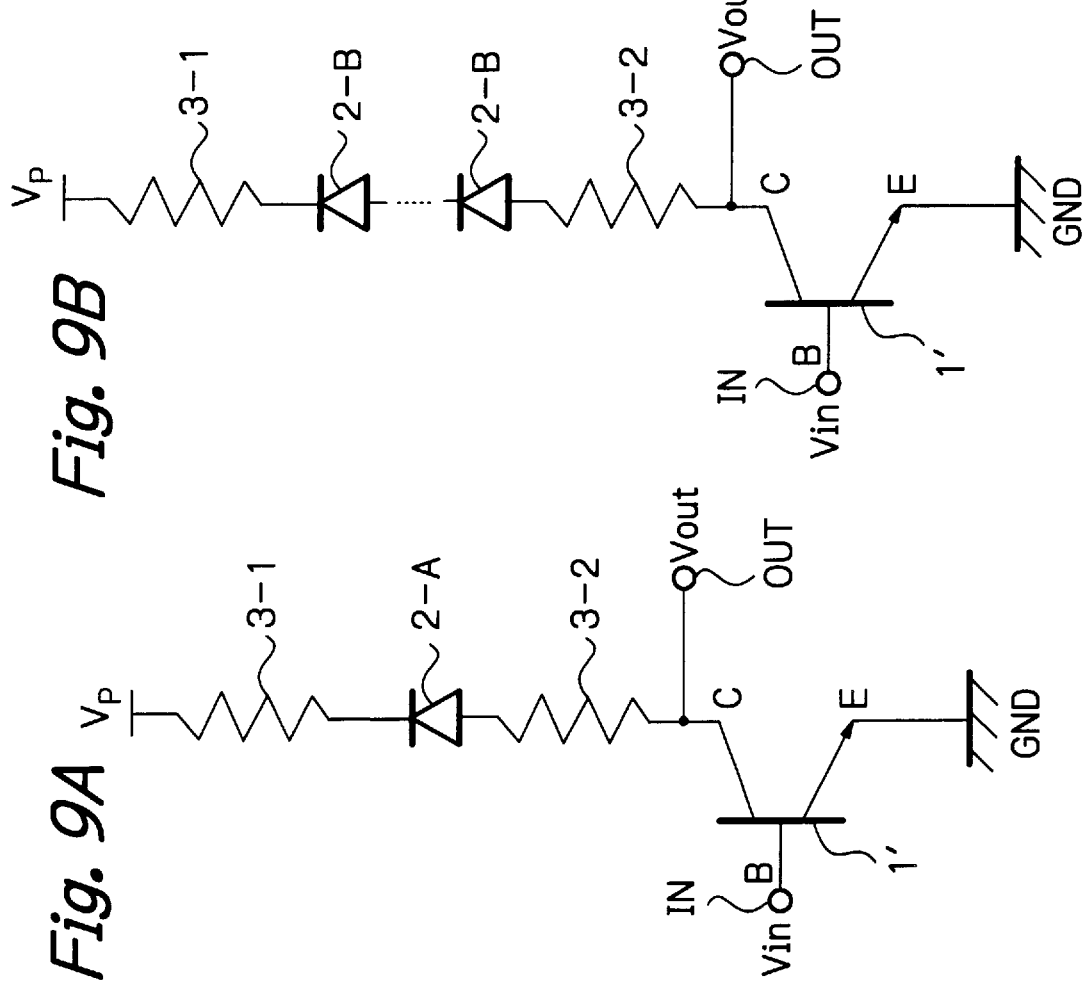

In FIG. 9C, which illustrates a second modification of the bus driver of FIG. 9A, parallel-connected diodes 2-B are provided instead of the diode 2-A of FIG. 9A.

The bus drivers of FIGS. 9B and 9C operate in the same way as the bus driver of FIG. 9A. In this case, the forward current of the diodes 2-B is a little smaller than that of the diode 2-A, while the forward current of the diodes 2-C is a little larger than that of the diode 2-A.

In FIG. 10A, which illustrates a sixth embodiment of the bus driver according to the present invention, the resistor 3-1 of FIG. 9A is not provided. The bus driver of FIG. 10A operates in the same way as the bus driver of FIG. 8A.

In FIG. 10B, which illustrates a first modification of the bus driver of FIG. 10A, series-connected diodes 2-B are provided instead of the diode 2-A of FIG. 10A.

In FIG. 10C, which illustrates a second modification of the bus driver of FIG. 10A, parallel-connected diodes 2-B are provided instead of the diode 2-A of FIG. 10A.

The bus drivers of FIGS. 10B and 10C operate in the same way as the bus driver of FIG. 10A. In this case, the forward current of the diodes 2-B is a little smaller than that of the diode 2-A, while the forward current of the diodes 2-C is a little larger than that of the diode 2-A.

Assume that the bus driver of FIG. 5A is applied to the data processing system of FIGS. 1 and 3. In this case, when the input voltage $V_{in}$ of the bus driver of FIG. 5A included in the package 101-3 is switched from high to low, the voltages at the bus receivers at the packages 101-1, 101-3, 101-4, . . . , 101-7 are obtained as shown in FIG. 11. As shown in FIG. 11, the ringing effect generated in each of the voltages of the bus receivers is reduced, since the bus driver of FIG. 5A has a noise removing circuit formed by the diode 2-A and the resistor 3-1. Therefore, it takes less than 20 ns to converge the voltages at the bus receivers. This substantially decreases the signal propagation delay time.

As explained hereinabove, according to the present invention, the signal propagation delay time can be reduced.

What is claimed is:

1. A bus driver for driving a bus, comprising:
   first and second power supply terminals;
   an input terminal for receiving an input signal;
   an output terminal connected to said bus;
   a switching element, connected between said output terminal and said second power supply terminal, said switching element being controlled by a voltage at said input terminal; and a noise removing circuit comprising a first diode and a first resistor, connected in series between said first power supply terminal and said output terminal, reducing a ringing effect on said bus, wherein said first diode is arranged in a forward conduction direction with respect to current flow between said first and second power supply terminals through said first diode, and wherein said switching element comprises an open-drain type MIS transistor having a drain connected to said output terminal.

2. The bus driver as set forth in claim 1, further comprising a second resistor connected in series to said first diode, said first diode being sandwiched by said first and second resistors.

3. The bus driver as set forth in claim 1, further comprising at least one second diode connected in series to said first diode, said second diode being arranged in a forward conduction direction with respect to current flow between said first and second power supply terminals through said second diode, wherein said at least one second diode is connected between said first diode and said first resistor.

4. The bus driver as set forth in claim 1, further comprising at least one second diode connected in parallel to said first diode, said second diode being arranged in a forward conduction direction with respect to current flow between said first and second power supply terminals through said second diode.

5. A bus driver for driving a bus, comprising:

first and second power supply terminals;

an input terminal for receiving an input signal;

an output terminal connected to said bus;

a switching element, connected between said output terminal and said second power supply terminal, said switching element being controlled by a voltage at said input terminal; and a noise removing circuit comprising a first diode and a first resistor, connected in series between said first power supply terminal and said output terminal, reducing a ringing effect on said bus, wherein said first diode is arranged in a forward conduction direction with respect to current flow between said first and second power supply terminals through said first diode, and wherein said switching element comprises an open-collector type bipolar transistor having a collector connected to said output terminal.

6. The bus driver as set forth in claim 5, further comprising a second resistor connected in series to said first diode, said first diode being sandwiched by said first and second resistors.

7. The bus driver as set forth in claim 5, further comprising at least one second diode connected in series to said first diode, said second diode being arranged in a forward conduction direction with respect to current flow between said first and second power supply terminals through said second diode.

8. The bus driver as set forth in claim 5, further comprising at least one second diode connected in parallel to said first diode, said second diode being arranged in a forward conduction direction with respect to current flow between said first and second power supply terminals through said second diode.

9. A bus driver for driving a bus, comprising:

a first power supply terminal for receiving a first voltage;

a second power supply terminal for receiving a second voltage lower than said first voltage;

an input terminals;

an output terminal;

a MIS transistor having a gate connected to said input terminal, a drain connected to said output terminal and a source connected to said second power supply terminal;

a first diode having an anode connected to said output terminal and a cathode; and a first resistor connected between said first power supply terminal and the cathode of said first diode, wherein said first diode and said first resistor reduce a ringing effect on said bus.

10. The bus driver as set forth in claim 9, further comprising at least one second diode connected in series to said first diode, and disposed between said first diode and said first resistor.

11. The bus driver as set forth in claim 9, further comprising at least one second diode connected in parallel to said first diode.

12. The bus driver as set forth in claim 9, further comprising a second resistor connected between the anode of said diode and said output terminal.

13. A bus driver for driving a bus, comprising:

a first power supply terminal for receiving a first voltage;

a second power supply terminal for receiving a second voltage lower than said first voltage;

an input terminal;

an output terminal;

a MIS transistor having a gate connected to said input terminal, a drain connected to said output terminal and a source connected to said second power supply terminal;

a first diode having a cathode connected to said first power supply terminal and an anode; and a resistor connected between the anode of said first diode and said output terminal, wherein said first diode and said first resistor reduce a ringing effect on said bus.

14. The bus driver as set forth in claim 13, further comprising at least one second diode connected in series to said first diode.

15. The bus driver as set forth in claim 13, further comprising at least one second diode connected in parallel to said first diode.

16. A bus driver for driving a bus, comprising:

a first power supply terminal for receiving a first voltage;

a second power supply terminal for receiving a second voltage lower than said first voltage;

an input terminal;

an output terminal;

a bipolar transistor having a base connected to said input terminal, a collector connected to said output terminal and an emitter connected to said second power supply terminal;

a first diode having an anode connected to said output terminal and a cathode; and a first resistor connected between said first power supply terminal and the cathode of said first diode, wherein said first diode and said first resistor reduce a ringing effect on said bus.

17. The bus driver as set forth in claim 16, further comprising at least one second diode connected in series to said first diode.

18. The bus driver as set forth in claim 16, further comprising at least one second diode connected in parallel to said first diode.

19. The bus driver as set forth in claim 16, further comprising a second resistor connected between the anode of said diode and said output terminal.

20. A bus driver for driving a bus, comprising:

a first power supply terminal for receiving a first voltage;

a second power supply terminal for receiving a second voltage lower than said first voltage;

an input terminal;

an output terminal;

a bipolar transistor having a base connected to said input terminal, a collector connected to said output terminal and an emitter connected to said second power supply terminal;

a first diode having a cathode connected to said first power supply terminal and an anode; and a resistor connected between the anode of said first diode and said output terminal, wherein said first diode and said first resistor reduce a ringing effect on said bus.

21. The bus driver as set forth in claim 20, further comprising at least one second diode connected in series to said first diode.

22. The bus driver as set forth in claim 20, further comprising at least one second diode connected in parallel to said first diode.

* * * * *

UNITED STATES PATENT AND TRADEMARK OFFICE
CERTIFICATE OF CORRECTION

PATENT NO. : 6,211,694 B1
DATED : April 3, 2001
INVENTOR(S) : Hiroshi Kamiya

It is certified that error appears in the above-identified patent and that said Letters Patent is hereby corrected as shown below:

Column 2,
Line 54, delete "styb" insert -- stub --

Column 4,
Line 8, delete "he" insert -- the --

Column 5,
Line 61, delete "." insert -- , wherein said at least one second diode is connected between said first diode and said first resistor. --

Signed and Sealed this

Twenty-ninth Day of January, 2002

Attest:

JAMES E. ROGAN
Attesting Officer     Director of the United States Patent and Trademark Office